United States Patent
Lu et al.

(10) Patent No.: US 10,613,669 B2
(45) Date of Patent: Apr. 7, 2020

(54) DISPLAY PANEL AND DISPLAY DEVICE INCLUDING FORCE-SENSING SENSOR WITH INCREASED AMPLITUDE OF OUTPUT SIGNAL

(71) Applicant: Shanghai Tianma Micro-Electronics Co., Ltd., Shanghai (CN)

(72) Inventors: Feng Lu, Shanghai (CN); Haga Hiroshi, Shanghai (CN); Takatori Kenichi, Shanghai (CN); Yingteng Zhai, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 0 days.

(21) Appl. No.: 15/920,292

(22) Filed: Mar. 13, 2018

(65) Prior Publication Data

US 2019/0064986 A1    Feb. 28, 2019

(30) Foreign Application Priority Data

Aug. 30, 2017    (CN) .......................... 2017 1 0762440

(51) Int. Cl.
*G06F 3/045* (2006.01)
*G06F 3/041* (2006.01)
(Continued)

(52) U.S. Cl.
CPC .......... *G06F 3/0414* (2013.01); *G06F 3/0416* (2013.01); *G09G 3/3208* (2013.01);
(Continued)

(58) Field of Classification Search
CPC .... G06F 3/0414; G06F 3/0412; G06F 3/0416; G09G 3/3208; G09G 3/3648;
(Continued)

(56) References Cited

U.S. PATENT DOCUMENTS 5,640,090 A * 6/1997 Furuya ...................... G01L 1/18
324/251
2010/0123686 A1 * 5/2010 Klinghult .............. G06F 3/0412
345/178

(Continued)

FOREIGN PATENT DOCUMENTS

CN         105511679 A  *  4/2016  ........... G06F 3/0416
CN         106468967 A      3/2017
(Continued)

OTHER PUBLICATIONS

JP2018-044726, Office Action dated Nov. 21, 2018.
(Continued)

*Primary Examiner* — Adam J Snyder
(74) *Attorney, Agent, or Firm* — Alston & Bird LLP

(57) ABSTRACT

A display panel and a display device reduces the adverse effects on touch function and display function caused by high heat generation of a force-sensing sensor. The display panel includes, in part, a force sensing sensor, an amplification circuit and a drive chip. The force-sensing sensor includes a first input, a second input, a first output and a second output. The amplification circuit is associated with the force-sensing sensor and includes a first amplification input, a second amplification input and at least one amplification output, wherein the first amplification input of the amplification circuit is coupled to the first output of the force-sensing sensor and the second amplification input of the amplification circuit is coupled to the second output of the force-sensing sensor. The drive chip is coupled to the amplification output of the amplification circuit.

12 Claims, 9 Drawing Sheets

(51) Int. Cl.
*G09G 3/36* (2006.01)
*G09G 3/3208* (2016.01)
*H01L 27/32* (2006.01)
*G02F 1/1368* (2006.01)
*G02F 1/1362* (2006.01)
*G02F 1/1333* (2006.01)
*H01L 29/786* (2006.01)
*H01L 25/075* (2006.01)
*H01L 27/12* (2006.01)
*H01L 25/16* (2006.01)

(52) U.S. Cl.
CPC ....... *G09G 3/3648* (2013.01); *H01L 27/3225* (2013.01); *H01L 27/3244* (2013.01); *G02F 1/1368* (2013.01); *G02F 1/13338* (2013.01); *G02F 1/136286* (2013.01); *G06F 3/0412* (2013.01); *H01L 25/0753* (2013.01); *H01L 25/167* (2013.01); *H01L 27/124* (2013.01); *H01L 27/1222* (2013.01); *H01L 27/323* (2013.01); *H01L 27/3262* (2013.01); *H01L 27/3265* (2013.01); *H01L 29/78672* (2013.01)

(58) Field of Classification Search
CPC ........... G02F 1/13338; G02F 1/136286; G02F 1/1368; H01L 25/0753; H01L 25/167; H01L 27/1222; H01L 27/124; H01L 27/3225; H01L 27/323; H01L 27/3245; H01L 27/3262; H01L 27/3265; H01L 29/78672
USPC ....................................................... 345/173
See application file for complete search history.

(56) References Cited

U.S. PATENT DOCUMENTS

| | | | |
|---|---|---|---|
| 2010/0201635 A1* | 8/2010 | Klinghult | G06F 3/0414 345/173 |
| 2013/0009905 A1* | 1/2013 | Castillo | G06F 3/044 345/174 |
| 2013/0018489 A1* | 1/2013 | Grunthaner | G06F 3/041 700/73 |
| 2013/0076646 A1* | 3/2013 | Krah | G06F 3/0414 345/173 |
| 2013/0154998 A1* | 6/2013 | Yang | H03K 17/9625 345/174 |
| 2014/0353614 A1 | 12/2014 | Park | |
| 2015/0002452 A1* | 1/2015 | Klinghult | G06F 3/0416 345/174 |
| 2016/0048266 A1* | 2/2016 | Smith | G06F 3/0418 345/174 |
| 2016/0103545 A1* | 4/2016 | Filiz | G01L 1/18 345/174 |
| 2016/0190998 A1* | 6/2016 | Sasai | H03F 1/26 330/9 |
| 2017/0038879 A1* | 2/2017 | Hsiao | G06F 3/0414 |
| 2017/0185211 A1* | 6/2017 | Lu | G06F 3/0412 |

FOREIGN PATENT DOCUMENTS

| | | |
|---|---|---|
| CN | 107092120 A | 8/2017 |
| JP | 1994207948 A | 7/1994 |
| JP | 1996501154 A | 2/1996 |
| JP | 1996201490 A | 8/1996 |
| JP | 2010236992 A | 10/2010 |
| JP | 2012509605 A | 4/2012 |

OTHER PUBLICATIONS

CN First Office Action, Application No. 201710762440.4, dated Jun. 28, 2019.

JP Second Office Action, Application No. 2018-044726, dated Jun. 17, 2019.

* cited by examiner

DISPLAY PANEL AND DISPLAY DEVICE INCLUDING FORCE-SENSING SENSOR WITH INCREASED AMPLITUDE OF OUTPUT SIGNAL

CROSS-REFERENCE TO RELATED APPLICATIONS

The present application claims priority to Chinese Patent Application No. 201710762440.4, filed on Aug. 30, 2017, the content of which is incorporated herein by reference in its entirety.

TECHNICAL FIELD

The present disclosure relates to the field of display technologies, and particularly, to a display panel and a display device.

BACKGROUND

With the development of touch display technologies, in addition to the traditional touch technology that can detect the touch position, technology capable of detecting the force of the touch has been in use. The force touch can achieve more convenient human-computer interaction. The force-sensing sensor is an essential element for realizing the force touch. The force-sensing sensor is integrated on the display panel. A connection line is provided between the force-sensing sensor and a drive chip. The drive chip provides bias voltage for the force-sensing sensor via the connection line, and receives signal output from the force-sensing sensor via the connection line, in order to detect the force touch.

The greater the magnitude of the output signal from the force-sensing sensor, the better the effect of force detection based on the output signal. The magnitude of the output signal from the force-sensing sensor is positively correlated with the absolute value of the bias voltage of the force-sensing sensor. Therefore, the bias voltage of the force-sensing sensor can be increased, in order to increase the magnitude of the output signal thereof. However, the generated heat of the force-sensing sensor increases with the increasing of the bias voltage of the force-sensing sensor, resulting in adverse effects on the force touch function or the display function.

SUMMARY

Embodiments of the present invention provide a display panel and a display device that can improve the amplitude of the output signal from the force-sensing sensor without increasing the heat generation of the force-sensing sensor, thereby reducing the adverse effects on touch function and display function caused by such heat.

In one aspect, embodiments of the present invention provide a display panel. The display panel includes, in part, a force-sensing sensor, the force-sensing sensor including a first input, a second input, a first output and a second output; an amplification circuit associated with the force-sensing sensor, the amplification circuit including a first amplification input, a second amplification input and at least one amplification output, wherein the first amplification input of the amplification circuit is connected to the first output of the force-sensing sensor, and the second amplification input of the amplification circuit is connected to the second output of the force-sensing sensor; and a drive chip, the drive chip being connected to the at least one amplification output of the amplification circuit.

In another aspect, embodiments of the present invention provide a display device including the display panel as described above.

BRIEF DESCRIPTION OF DRAWINGS

In order to clarify the technical solutions in the embodiments of the present disclosure or in the related art, the accompanying drawings for describing the embodiments or the related art are briefly introduced as follows. It should be noted the drawings in the following description illustrate some embodiments of the present disclosure, and those skilled in the art can derive other drawings from these without creative efforts.

DESCRIPTION OF EMBODIMENTS

In order to clarify the purposes, technical solutions and advantages of the embodiments of the present disclosure, the technical solutions of the embodiments are described in detail as below with reference to the accompanying drawings It should be understood that the embodiments described hereinafter are only a part of all the embodiments. On the basis of the embodiments in the present disclosure, all other embodiments that are driven by those skilled in the art without any creative efforts fall into the protection scope of the present disclosure.

The technical terms used in the embodiments of the present disclosure are merely used for the purpose of describing particular embodiments, but not intended to limit the present disclosure. The singular forms "a", "an" and "the" used in the embodiments of the present disclosure and the appended claims also include the meaning of the plural forms, unless otherwise noted.

Figure 1:
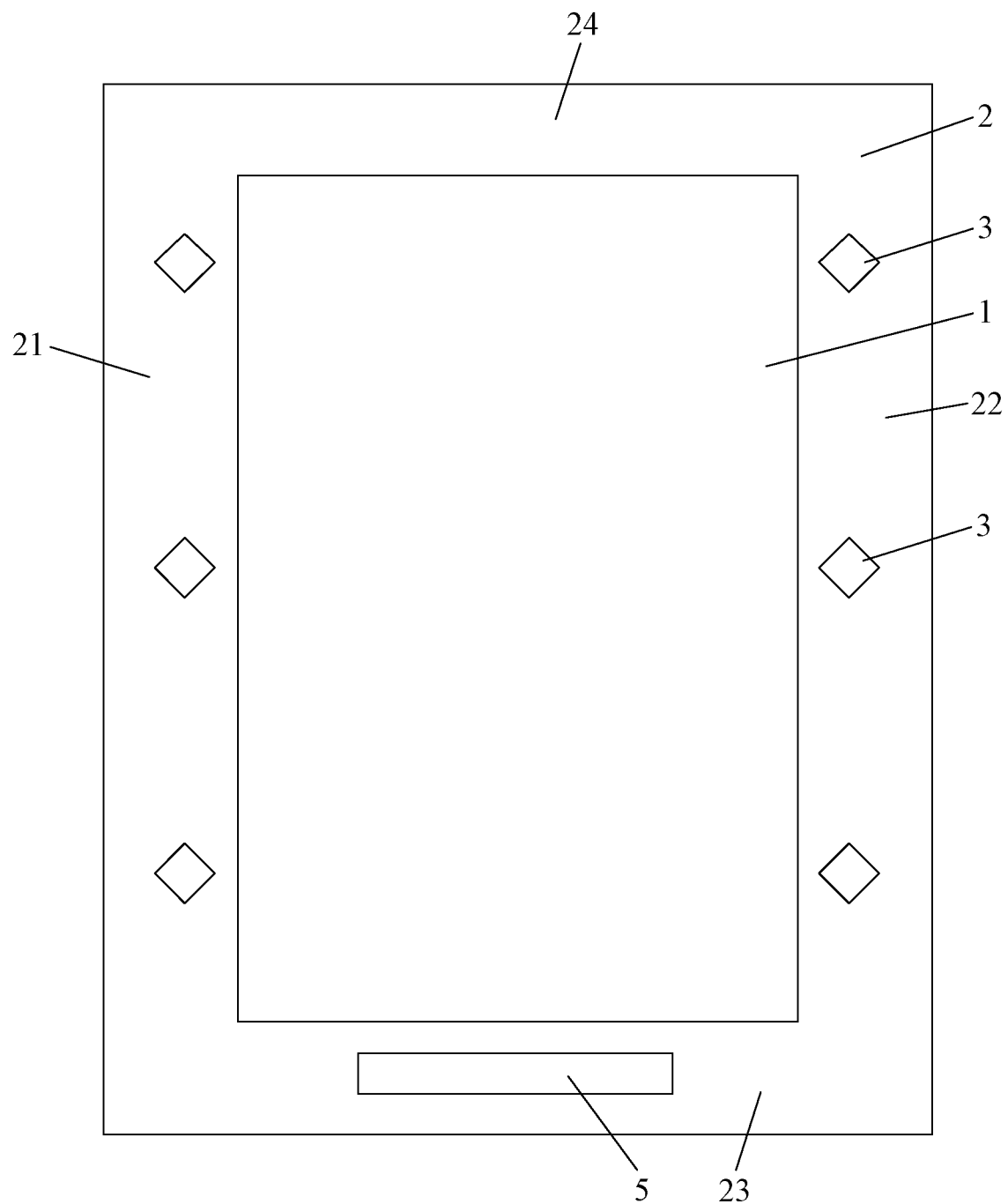
FIG. 1 is a high-level simplified schematic diagram of a display panel according to an embodiment of the present disclosure.
Figure 2:
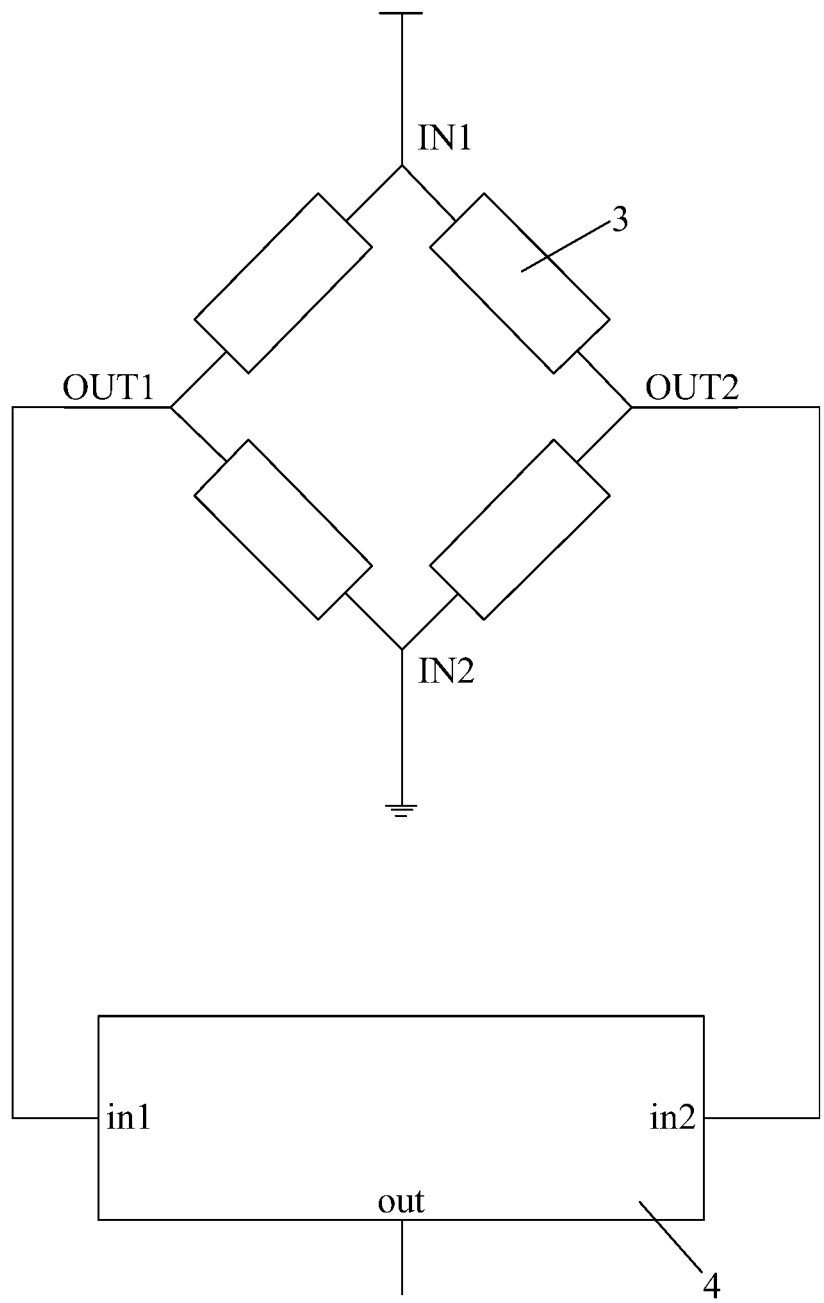
FIG. 2 is a schematic diagram of a connection between a force-sensing sensor and an amplification circuit associated with the force-sensing sensor in the display panel shown in FIG. 1.

FIG. 1 is a schematic diagram of a display panel according to an embodiment of the present disclosure. The display panel provided in this embodiment includes a display area 1 and a non-display area 2. A plurality of force-sensing sensors 3 is arranged in the non-display area 2. It should be understood that the force-sensing sensors 3 arranged in the non-display area 2 are merely exemplary, i.e., the force-sensing sensors 3 also can be arranged in the display area 1 in other achievable embodiments. FIG. 2 is a schematic diagram of a connection between a force-sensing sensor and an amplification circuit associated with the force-sensing sensor in the display panel shown in FIG. 1. Each of the force-sensing sensors 3 includes a first input IN1, a second input IN2, a first output OUT1 and a second output OUT2. The display panel further includes an amplification circuit 4 associated with a force-sensing sensor 3. The amplification circuit 4 includes a first amplification input in1, a second amplification input in2 and at least one amplification output out1. The first amplification input in1 of the amplification circuit 4 is connected to the first output OUT1 of the force-sensing sensor 3, and the second amplification input in2 of the amplification circuit 4 is connected to the second output OUT2 of the force-sensing sensor 3. As shown in FIG. 1, the display panel further includes a drive chip 5 that is connected to the at least one amplification output of the amplification circuit (not shown in FIG. 1).

Specifically, the first input IN1 and the second input IN2 of the force-sensing sensor 3 are connected to a bias voltage input circuit, and the bias voltage input circuit provides bias voltage. For example, the first input IN1 of the force-sensing sensor 3 is connected to a bias voltage end of the bias voltage input circuit, wherein the bias voltage end provides a positive voltage or a negative voltage. The second input IN2 of the force-sensing sensor 3 is connected to a ground end of the bias voltage input circuit, wherein the ground end provides the zero potential or other ground reference potentials. Under the bias voltage, the force-sensing sensor can work normally, and the bias voltage input circuit can be realized by the drive chip 5 (see FIG. 1) or a separate circuit other than the drive chip 5. The amplification circuit 4 is used to amplify the amplitude of the output signal from the force-sensing sensor 3 and output the amplified signal to the drive chip 5. Therefore, the drive chip 5 can detect force directly depending on the amplified signal, without the need to increase the bias voltage of the force-sensing sensor.

The display panel according to the embodiment of the present invention is configured such that the force-sensing sensor is connected to the drive chip through the amplification circuit, i.e., the amplitude of output signal from the force-sensing sensor is amplified by the amplification circuit and then transmitted to the drive chip. In such way, the drive chip can detect force directly depending on the amplified signal, without the need to increase the bias voltage of the force-sensing sensor. In other words, the amplitude of output signal from the force-sensing sensor is increased without increasing the heat generation of the force-sensing sensor. Therefore, adverse effects on the touch function or display function caused by high heat generation of the force-sensing sensor are reduced.

Figure 3:
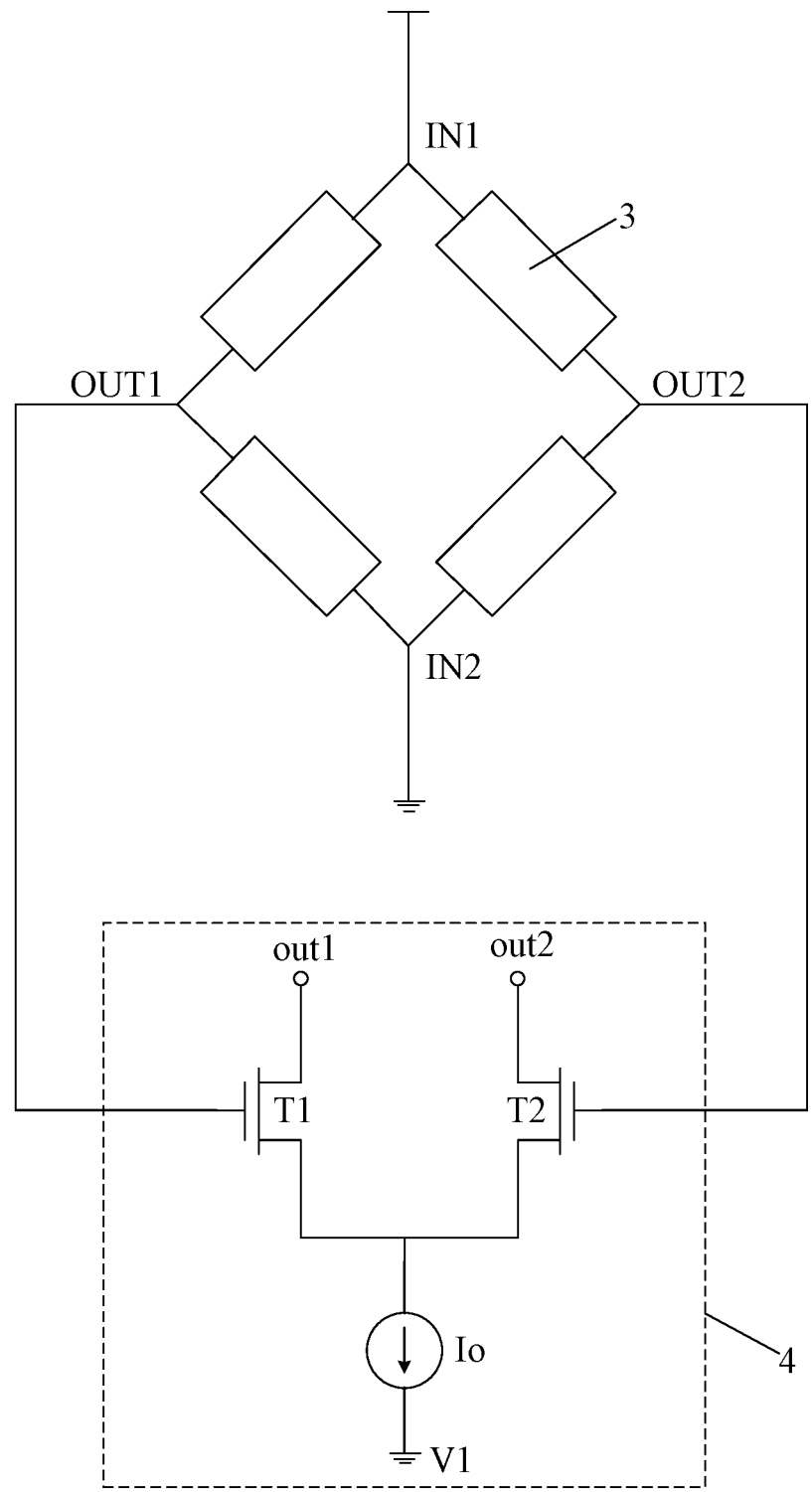
FIG. 3 is a schematic diagram of another connection between a force-sensing sensor and an amplification circuit associated with the force-sensing sensor in the display panel shown in FIG. 1.

In another embodiment shown in FIG. 3, which is a schematic diagram of another connection between a force-sensing sensor and an amplification circuit associated with the force-sensing sensor in the display panel shown in FIG. 1, the amplification circuit 4 includes a first amplification output out1 and a second amplification output out2. The amplification circuit 4 is used to amplify the amplitude of signal from the first output OUT1 of the force-sensing sensor 3 and then output the amplified signal in a form of electric current to the first amplification output out1 of the amplification circuit 4. The amplification circuit 4 is further used to amplify the amplitude of signal from the second output OUT2 of the force-sensing sensor 3 and then output the amplified signal in a form of electric current to the second amplification output out2 of the amplification circuit 4.

Specifically, after the drive chip 5 obtains the current value at the first amplification output out1 as well as the current value at the second amplification output out2, the drive chip can achieve force detection by processing these two current values.

In an embodiment shown in FIG. 3, the amplification circuit 4 includes: a first thin film transistor T1, wherein a control end of the first thin film transistor T1 is connected to the first output OUT1 of the force-sensing sensor 3 and a first end of the first thin film transistor T1 is connected to the amplification output out1 of the amplification circuit; a second thin film transistor T2, wherein a control end of the second thin film transistor T2 is connected to the second output OUT2 of the force-sensing sensor 3 and a first end of the second thin film transistor T2 is connected to the second amplification output out2 of the amplification circuit; and a constant current source Io, wherein a first end of the constant current source Io is connected to a second end of the first thin film transistor T1 and a second end of the second thin film transistor T2, and a second end of the constant current source Io is connected to a first reference potential end V1, for example, the second end of the constant current source Io is grounded.

Specifically, the first thin film transistor T1 and the second thin film transistor T2 operate in a linear area, and function to shunt electric current. The constant current source Io is used to provide a constant electric current. Under the separate controls from the first output OUT1 and the second output OUT2 of the force-sensing sensor 3, as the first thin film transistor T1 and the second thin film transistor T2 function to shunt the electric current generated by the constant current source Io, the first thin film transistor T1 and the second thin film transistor T2 have corresponding resistance values respectively. When a difference between the voltage signal of the first output OUT1 and the voltage signal of the second output OUT2 of the force-sensing sensor 3 is zero, the first thin film transistor T1 has the same equivalent resistance as the second thin film transistor T2, so that the current value in the branch circuit where the first thin film transistor T1 is located is the same as the current value in the branch circuit where the second thin film transistor T2 is located. A difference between the voltage signal of the first output OUT1 and the voltage signal of the second output OUT2 of the force-sensing sensor 3 can result in that the equivalent resistance of the first thin film transistor T1 and the equivalent resistance of the second thin film transistor T2 are different, so that the current values in the branch circuit where the first thin film transistor T1 is located and in the branch circuit where the second thin film transistor T2 is located are different. Depending on the current values in the branch circuit where the first thin film transistor T1 is located and in the branch circuit where the second thin film transistor T2 is located, the drive chip 5 can realize force detection. The amplification circuit shown in FIG. 3 is further described below by the aids of the results of the exemplary simulation shown in Table I below.

TABLE I

|  | not under force | under force |
|---|---|---|
| IN1 voltage value |  | 2.5 V |
| IN2 voltage value |  | −2.5 V |
| out1 voltage value |  | 8 V |
| out2 voltage value |  | 8 V |
| V1 voltage value |  | −8 V |
| Io current value |  | 0.1 mA |
| resistance value of bridge arm | 20000 kΩ | ±20 Ω |
| OUT1 voltage value |  | increase by 0.6 mV |
| OUT2 voltage value |  | decrease by 0.6 mV |
| out1 current value | 0.05 mA | increase by 0.02 μA |
| out2 current value | 0.05 mA | decrease by 0.02 μA |

For example, Table 1 shows exemplary simulation results of the circuit shown in FIG. 3. As shown in Table 1, the voltage value input to the first input IN1 of the force-sensing sensor 3 is 2.5V, the voltage value input to the second input IN2 of the force-sensing sensor 3 is −2.5V, the voltage values at the first amplification output out1 and the second amplification output out2 are both 8V, the voltage value at the first reference potential end V1 is −8V, and the output current of the constant current source Io is 0.1 mA. When the display panel is not under force, the resistance value of each bridge arm in the force-sensing sensor 3 is 20000 kΩ, the current values at the first amplification output out1 and the second amplification output out2 are both 0.05 mA. When the display panel is under force, the resistance value of a single bridge arm changes by ±20Ω. For example, the resistance values of two of four bridge arms increase, wherein the resistance values of these two bridge arms increase by 20Ω, respectively; the resistance values of the other two of the four bridge arms decrease, wherein the resistance values of these two bridge arms decrease by 20Ω, respectively. When the display panel is under force, the voltage value of the first output OUT1 of the force-sensing sensor 3 increases by 0.6 mV, the voltage value of the second output OUT2 of the force-sensing sensor 3 decreases by 0.6 mV, and the current values at the first amplification output out1 and at the second amplification output out2 change by ±0.02 μA based on 0.05 mA, for example, the current value at the first amplification output out1 is 0.05 mA+0.02 μA, while the current value at the second amplification output out2 is 0.05 mA−0.02 μA. When the display panel is under force, the voltage values output by the force-sensing sensor 3 change by ±0.6 mV, and the current values output by the amplification circuit 4 change by ±0.02 μA. That is, amplification effect on output signal from the force-sensing sensor is achieved.

Figure 4:
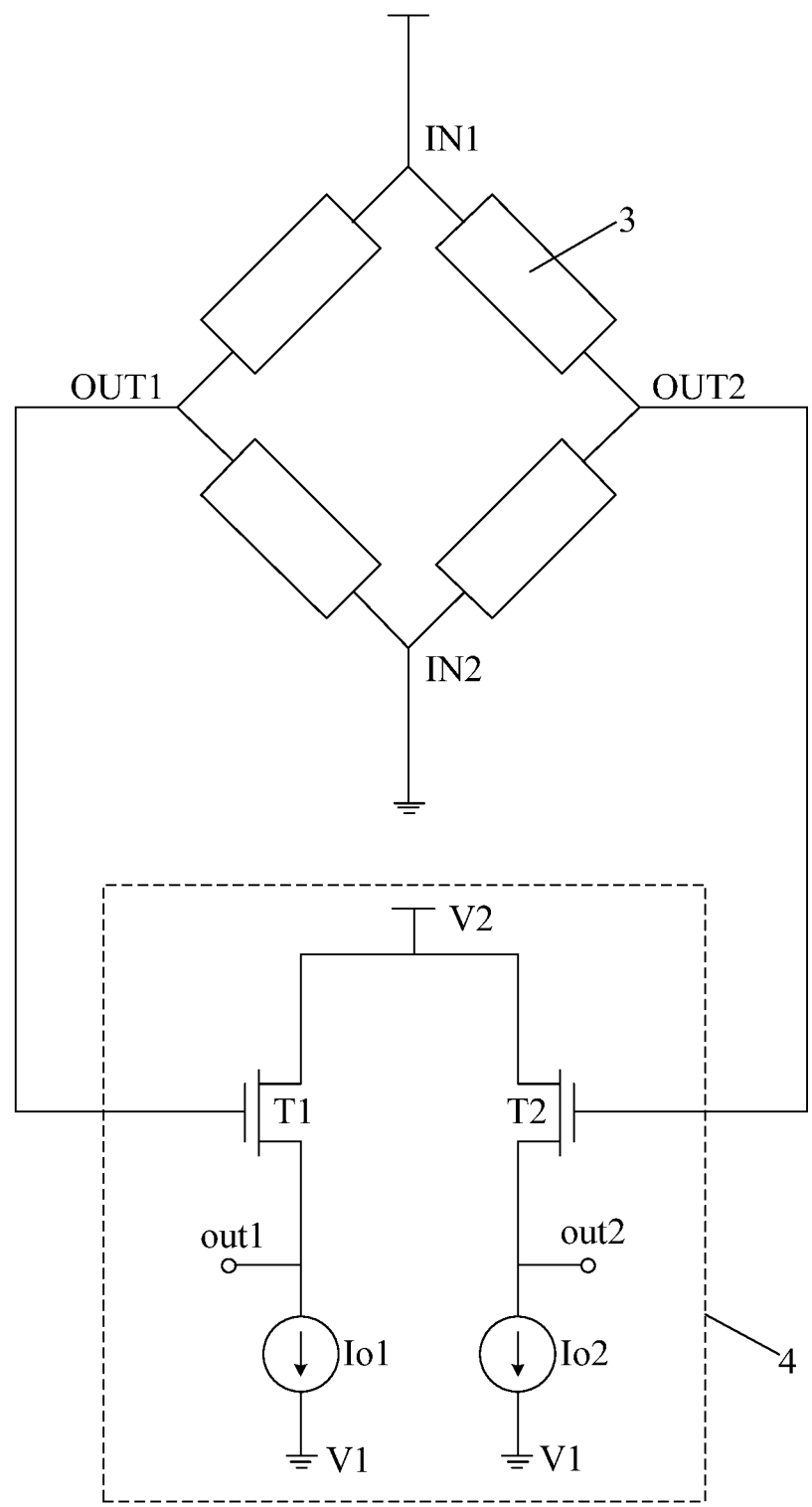
FIG. 4 is a schematic diagram of another connection between a force-sensing sensor and an amplification circuit associated with the force-sensing sensor in the display panel shown in FIG. 1.

Another embodiment is shown in FIG. 4. FIG. 4 is a schematic diagram of another connection between a force-sensing sensor and an amplification circuit associated with the force-sensing sensor in the display panel shown in FIG. 1. The amplification circuit 4 includes a first amplification output out1 and a second amplification output out2. The amplification circuit 4 is used to amplify the amplitude of voltage at the first output OUT1 of the force-sensing sensor 3 and then output the amplified voltage to the first amplification output out1 of the amplification circuit 4. The amplification circuit 4 is further used to amplify the amplitude of voltage at the second output OUT2 of the force-sensing sensor 3 and then output the amplified voltage to the second amplification output out2 of the amplification circuit 4.

After the drive chip 5 obtains the voltage values at the first amplification output out1 and at the second amplification output out2, the drive chip can realize detect force detection by processing these two voltage values.

In this embodiment shown in FIG. 4, the amplification circuit 4 further includes: a first thin film transistor T1, wherein a control end of the first thin film transistor T1 is connected to the first output OUT1 of the force-sensing sensor 3, a first end of the first thin film transistor T1 is connected to a second reference potential end V2 and a second end of the first thin film transistor T1 is connected to the first amplification output out1 of the amplification circuit 4; a second thin film transistor T2, wherein a control end of the second thin film transistor T2 is connected to the second output OUT2 of the force-sensing sensor 3, a first end of the second thin film transistor T2 is connected to a second reference potential end V2 and a second end of the second thin film transistor T2 is connected to the second amplification output out2 of the amplification circuit 4; a first constant current source Io1, wherein a first end of the first constant current source Io1 is connected to the first amplification output out1 of the amplification circuit 4 and a second end of the first constant current source Io1 is connected to the first reference potential end V1; and a second constant current source Io2, wherein a first end of the second constant current source Io2 is connected to the second amplification output out2 of the amplification circuit 4 and a second end of the second constant current source Io2 is connected to the first reference potential end V1.

The first current source Io1 and the second current source Io2 are used to amplify the divided voltage on the first thin film transistor T1 and the divided voltage on the second thin film transistor T2. The voltage at a branch circuit where the first thin film transistor T1 is located and the voltage at a branch circuit where the second thin film transistor T2 is located are both v2-v1, where v2 is the voltage value of the second reference potential end V2 and v1 is the voltage value of the first reference potential end V1. When a difference between the voltage signal of the first output OUT1 and the voltage signal of the second output end OUT2 of the force-sensing sensor 3 is zero, the first thin film transistor T1 has the same divided voltage value as the second thin film transistor T2, i.e., the voltage value at the first amplification output out1 of the amplification circuit 4 is same as the voltage value at the second amplification output out2 of the amplification circuit 4. When a difference between the voltage signal of the first output OUT1 and the voltage signal of the second output OUT2 of the force-sensing sensor 3 is present, the divided voltage value of the first thin film transistor T1 and the divided voltage value of the second thin film transistor T2 are different, i.e., the voltage value at the first amplification output out1 of the amplification circuit 4 and the voltage value at the second amplification output out2 of the amplification circuit 4 are different. Depending on the voltage value at the first amplification output out1 of the amplification circuit 4 and the voltage value at the second amplification output out2 of the amplification circuit 4, the drive chip 5 can realize force detection. The amplification circuit shown in FIG. 4 is further described below by the aids of the results of the exemplary simulation shown in Table II below.

TABLE II

|  | not under force | under force |
|---|---|---|
| IN1 voltage value |  | 2.5 V |
| IN2 voltage value |  | −2.5 V |
| V1 voltage value |  | −8 V |

TABLE II-continued

|  | not under force | under force |
|---|---|---|
| V2 voltage value |  | 8 V |
| Io1 current value |  | 0.5 mA |
| Io2 current value |  | 0.5 mA |
| resistance value of bridge arm | 20000 kΩ | ±20 Ω |
| OUT1 voltage value |  | increase by 0.6 mV |
| OUT2 voltage value |  | decrease by 0.6 mV |
| out1 voltage value | 4.78517 V | increase by 1.12 mV |
| out2 voltage value | 4.78517 V | decrease by 1.12 mV |

For example, Table 2 shows exemplary simulation results of the circuit shown in FIG. 4 in the embodiment of the present invention. As shown in Table 2, the voltage value input to the first input IN1 of the force-sensing sensor 3 is 2.5V, the voltage value input to the second input IN2 of the force-sensing sensor 3 is −2.5V, the voltage value at the second reference potential end V2 is 8V, the voltage value at the first reference potential end V1 is −8V, and the output current of the first constant current source Io1 and the output current of the second constant current source Io2 are both 0.5 mA. When the display panel is not under force, the resistance value of each bridge arm in the force-sensing sensor 3 is 20000 kΩ, the voltage value at the first amplification output out1 and the voltage value at the second amplification output out2 are both 4.78517V. When the display panel is under force, the resistance value of each bridge arm changes by ±20Ω. For example, the resistance values of two of four bridge arms increase, wherein the resistance values of these two bridge arms increase by 20Ω, respectively; the resistance values of the other two of the four bridge arms decrease, wherein the resistance values of these two bridge arms decrease by 20Ω, respectively. When the display panel is under force, the voltage value of the first output OUT1 of the force-sensing sensor 3 increases by 0.6 mV, the voltage value of the second output OUT2 of the force-sensing sensor 3 decreases by 0.6 mV, and the voltage value at the first amplification output out1 and the voltage value at the second amplification output out2 change ±1.12 mV on the basis of 4.78517V, for example, the voltage value at the first amplification output out1 is 4.78517V+1.12 mV, while the voltage value at the second amplification output out2 is 4.78517V−1.12 mV. When the display panel is under force, the voltage values output by the force-sensing sensor 3 change by ±0.6 mV, and the voltage values output by the amplification circuit 4 change by ±1.12 mV. That is, amplification effect on output signal from the force-sensing sensor is achieved.

Figure 5:
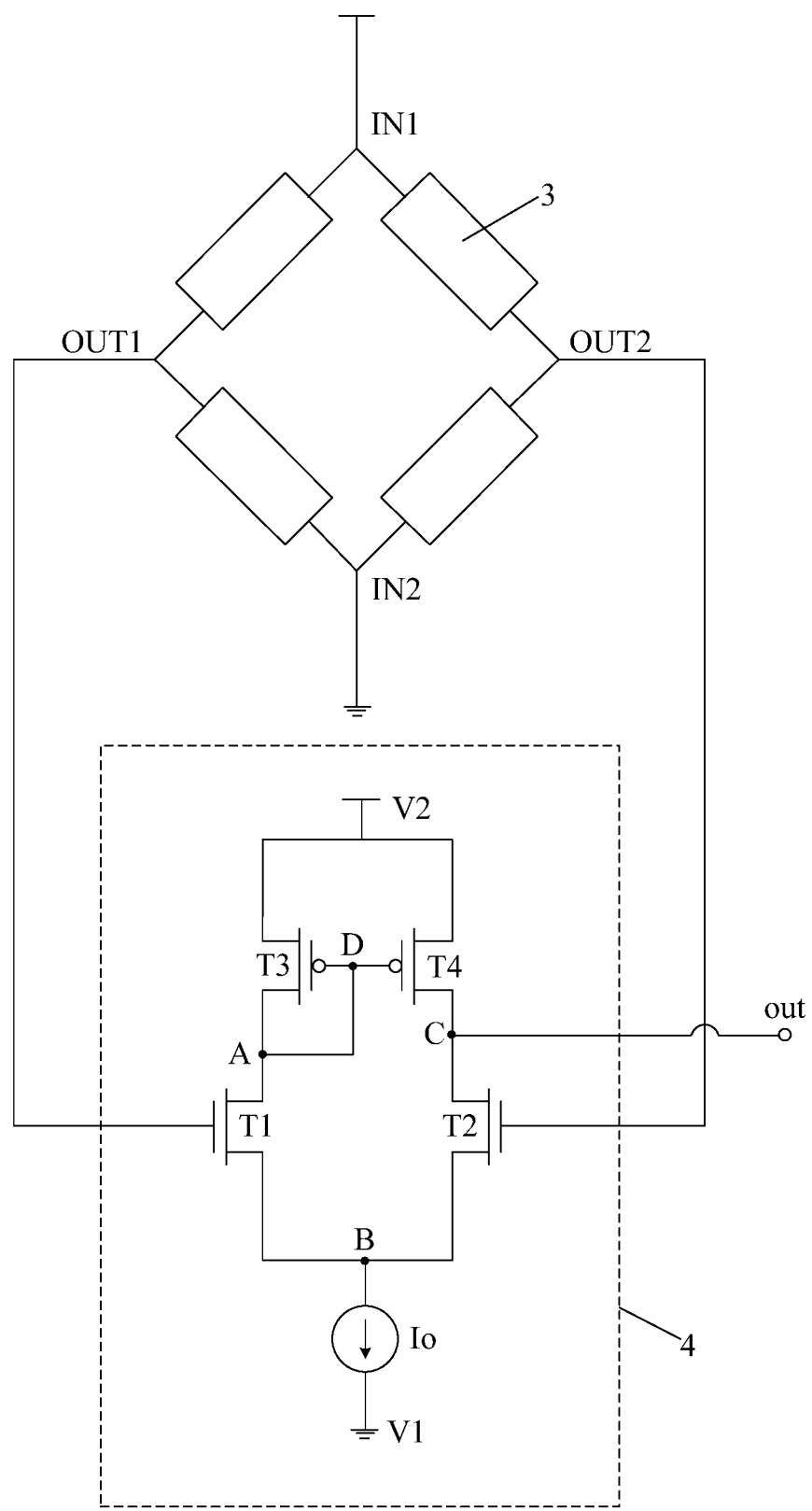
FIG. 5 is a schematic diagram of another connection between a force-sensing sensor and an associated amplification circuit associated with the force-sensing sensor in the display panel shown in FIG. 1.

Another embodiment is shown in FIG. 5. FIG. 5 is a schematic diagram of another connection between a force-sensing sensor and an amplification circuit associated with the force-sensing sensor in the display panel shown in FIG. 1. The amplification circuit 4 is a differential amplification circuit. The differential amplification circuit 4 includes only one amplification output out. The differential amplification circuit 4 is used to amplify the difference between the voltage value at the first output OUT1 of the force-sensing sensor 3 and the voltage value at the second output OUT2 of the force-sensing sensor 3, and then output the amplified difference to the amplification output out of the differential amplification circuit 4. The differential amplification circuit is a circuit capable of achieving the amplification of difference between two input signals.

In the force detection process, it is necessary to determine the magnitude of the force according to the difference between the voltage value at the first output OUT1 and the voltage value at the second output OUT2 of the force-sensing sensor 3. The magnification circuit shown in FIG. 5 is a differential amplification circuit, and the voltage value at the amplification output out of the differential amplification circuit directly reflects the difference between the amplified voltage value of the first output OUT1 and the amplified voltage value of the second output OUT2 of the force-sensing sensor 3. Therefore, instead of performing subtraction to the obtained values, the drive chip 5 can determine the magnitude of force directly depending on the obtained voltage value at the amplification output out.

In this embodiment shown in FIG. 5, the differential amplification circuit 4 further includes: a first thin film transistor T1, wherein a control end of the first thin film transistor T1 is connected to the first output OUT1 of the force-sensing sensor 3, a first end of the first thin film transistor T1 is connected to a first node A and a second end of the first thin film transistor T1 is connected to a second node B; a second thin film transistor T2, wherein a control end of the second thin film transistor T2 is connected to the second output OUT2 of the force-sensing sensor 3, a first end of the second thin film transistor T2 is connected to a third node C and a second end of the second thin film transistor T2 is connected to the second node B; a third thin film transistor T3, wherein a control end of the third thin film transistor T3 is connected to a fourth node D, a first end of the third thin film transistor T3 is connected to the first node A and a second end of the third thin film transistor T3 is connected to a second reference potential end V2; a fourth thin film transistor T4, wherein a control end of the fourth thin film transistor T4 is connected to a fourth node D, a first end of the fourth thin film transistor T4 is connected to the third node C and a second end of the fourth thin film transistor T4 is connected to a second reference potential end V2; and a constant current source Io, wherein a first end of the constant current source Io is connected to the second node B and a second end of the constant current source Io is connected to a first reference potential end V1. The fourth node D is connected to the first node A, the third node is connected to the amplification output out of the amplification circuit 4. The first thin film transistor T1 and the second thin film transistor T2 are both N-type transistors, and the third thin film transistor T3 and the fourth thin film transistor T4 are both P-type transistors. Alternatively, both the first thin film transistor T1 and the second thin film transistor T2 are P-type transistor, and the third thin film transistor T3 and the fourth thin film transistor T4 are both N-type transistors.

Specifically, if both the first output OUT1 and the second output OUT2 of the force-sensing sensor 3 output positive values, the first thin film transistor T1 and the second thin film transistor T2 are N-type transistors, and the third thin film transistor T3 and the fourth thin film transistor T4 is P-type transistors. On the contrary, if both the first output OUT1 and the second output OUT2 of the force-sensing sensor 3 output negative values, the first thin film transistor T1 and the second thin film transistor T2 are both P-type transistors, and the third thin film transistor T3 and the fourth thin film transistor T4 are both N-type transistors. The amplification circuit shown in FIG. 5 is further described below by the aids of the results of simulation, wherein the first thin film transistor T1 and the second thin film transistor T2 are N-type transistors, and the third thin film transistor T3 and the fourth thin film transistor T4 are P-type transistors.

TABLE 3

|  | not under force | under force |
|---|---|---|
| IN1 voltage value | | 2.5 V |
| IN2 voltage value | | −2.5 V |
| V1 voltage value | | −8 V |
| V2 voltage value | | 8 V |
| Io current value | | 0.01 mA |
| resistance of bridge arm | 20000 kΩ | ±20 Ω |
| OUT1 voltage value | | increase by 0.6 mV |
| OUT2 voltage value | | decrease by 0.6 mV |
| out voltage value | 2.811 V | 2.797 V |

For example, Table 3 shows exemplary simulation results of the circuit shown in FIG. 5 in the embodiment of the present invention. As shown in Table 3, the voltage value input to the first input IN1 of the force-sensing sensor 3 is 2.5V, the voltage value input to the second input IN2 of the force-sensing sensor 3 is −2.5V, the voltage value at the second reference potential end V2 is 8V, the voltage value at the first reference potential end V1 is −8V, and the output current value of the constant current source Io is 0.01 mA. When the display panel is not under force, the resistance value of each bridge arm in the force-sensing sensor 3 is 20000 kΩ, the voltage value at the amplification output out is 2.811V. When the display panel is under force, the resistance value of each bridge arm changes by ±20Ω. For example, the resistance values of two of four bridge arms increase, wherein the resistance values of these two bridge arms increase by 20Ω, respectively; the resistance values of the other two of the four bridge arms decrease, wherein the resistance values of these two bridge arms decrease by 20Ω, respectively. When the display panel is under force, the voltage value of the first output OUT1 of the force-sensing sensor 3 increases by 0.6 mV, the voltage value of the second output OUT2 of the force-sensing sensor 3 decreases by 0.6 mV, and the voltage value at the amplification output out is 2.797V. That is, when the display panel is under force, the voltage value at the amplification output out changes by 14 mV. When the display panel is under force, the difference between two voltage values at two outputs of the force-sensing sensor 3 changes by 1.2 mV, and the change of voltage at the output of the amplification circuit 4 is 14 mV, i.e., the amplification effect on output signal from the force-sensing sensor is achieved.

It should be further noted that the amplification circuits shown in FIG. 3 and FIG. 4 directly amplify the signal from the first output OUT1 and the signal from the second output OUT2 of the force-sensing sensor 3 and then transmit the amplified signals to the drive chip, and the subtraction is performed by the drive chip. In such way, even if signal interference appears in the process of transmitting these two signals through a lead wire, a noise caused by the interference in the signals can be excluded when the drive chip performs subtraction upon these two signals, thereby the final results becoming more precise. In contrast, the amplification circuit shown in FIG. 5 performs a subtraction between the signal from the first output OUT1 and the signal from the second output OUT2 of the force-sensing sensor 3 and then transmits an signal obtained after the subtraction through a lead wire to the drive chip, i.e., only one lead wire is needed to transmit the signal, thus, the number of lead wire is reduced, which is conducive to achieve a panel display panel with narrow frame.

Figure 6:
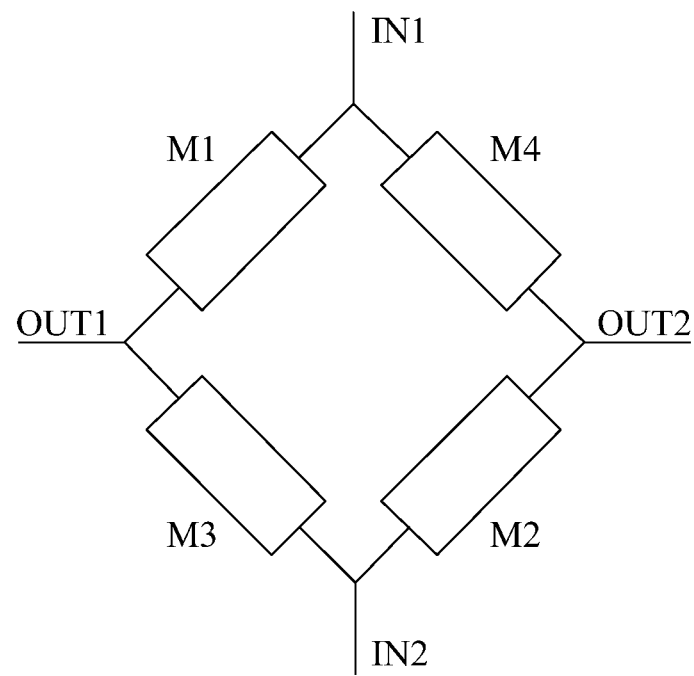
FIG. 6 is a structural schematic diagram of a force-sensing sensor according to an embodiment of the present disclosure.

FIG. 6 is a schematic diagram of a force-sensing sensor according to an embodiment of the present invention, wherein the force-sensing sensor is a Wheatstone bridge force-sensing sensor. The Wheatstone bridge force-sensing sensor includes a first input IN1, a second input IN2, a first output OUT1, a second output OUT2, a first strain force-sensing sensor M1, a second strain force-sensing sensor M2, a third strain force-sensing sensor M3 and a fourth strain force-sensing sensor M4. In each Wheatstone bridge force-sensing sensor, the first strain force-sensing sensor M1 is series-connected between the first input IN1 and the first output OUT1, the second strain force-sensing sensor M2 is series-connected between the second input IN2 and the second output OUT2, the third strain force-sensing sensor M3 is series-connected between the second input IN2 and the first output OUT1, and the fourth strain force-sensing sensor M4 is series-connected between the first input IN1 and the second output OUT2.

Figure 7:
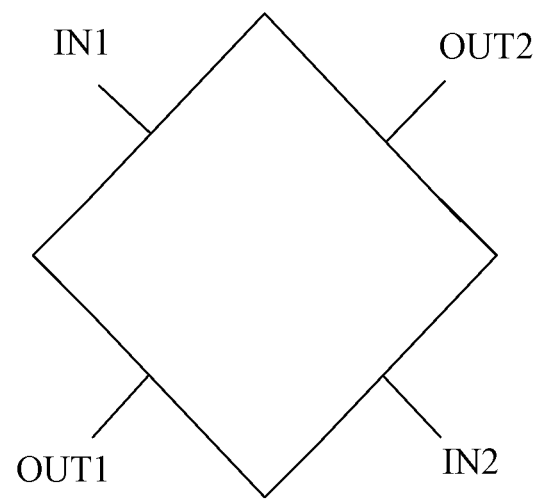
FIG. 7 is a schematic diagram of another force-sensing sensor according to an embodiment of the present disclosure.

FIG. 7 is a schematic diagram of a force-sensing sensor according to another embodiment of the present invention, wherein the force-sensing sensor is a silicon piezoresistive force sensor. The silicon piezoresistive force-sensing sensor may be a quadrangular structure. The four sides of the quadrangular structure are connected to the first input IN1, the second input IN2, the first output OUT1 and the second output OUT2, respectively. The first input IN1 and the second input IN2 are connected to two opposite sides, respectively. The first output OUT1 and the second output OUT2 are connected to two other opposite sides, respectively.

It should be noted that both the force-sensing sensor shown in FIG. 6 and the force-sensing sensor shown in FIG. 7 can be equivalent to an electric bridge including a first bridge arm, a second bridge arm, a third bridge arm and a fourth bridge arm, wherein the first to fourth bridge arms are connected end-to-end sequentially, the first input IN1 is located at the junction of the first bridge arm and the fourth bridge arm, the second input IN2 is located at the junction of the second bridge arm and the third bridge arm, the first output OUT1 is located at the junction of the first bridge arm and the second bridge arm, and the second output OUT2 is located at the junction of the third bridge arm and the fourth bridge arm. The electric bridge reaches an equilibrium state in which the voltage value at the first output OUT1 is equal to the voltage value at the second output OUT2, when the display panel is undeformed and the resistance value ratio of the first bridge arm to the second bridge arm is equal to the resistance value ratio of the fourth bridge arm to the third bridge arm. When the display panel is deformed and thus the four bridge arms are all deformed, the resistance value of each bridge arm is changed, thereby breaking the equilibrium state. That is, the resistance value ratio of the first bridge arm to the second bridge arm is unequal to the resistance value ratio of the fourth bridge arm to the third bridge arm, and the voltage value at the first output OUT1 is unequal to the voltage value at the second output OUT2. The difference between the voltage value at the first output OUT1 and the voltage value at the second output OUT2 corresponds to the force value applied on the display panel. During the force detection process, the corresponding force value can be determined by obtaining the voltage value at the first output OUT1 and the voltage value at the second output OUT2.

In an embodiment, as shown in FIG. 1, the display panel includes a display area 1, and a non-display area 2 surrounding the display area 1. The non-display area 2 includes a first area 21 and a second area 22, and the first area 21 and the second area 22 are located on opposite sides of the display area 1 in a first direction, respectively. The non-display area 2 further includes a third area 23 and a fourth area 24, and the third area 23 and the fourth area 24 are located on two opposite sides of the display area in a second direction, respectively. The force-sensing sensor 3 and the amplification circuit (not shown in FIG. 1) are both located in the first area 21 and/or the second area 22. The drive chip 5 is located in the third area 23.

Specifically, in the display panel, the force-sensing sensor 3 is relatively far away from the drive chip 5. The signals transmitted from the force-sensing sensor 3 to the drive chip 5 may be easily interfered by other elements in the display panel, causing signal distortion. Therefore, by arranging the amplification circuit in the first area 21 or the second area 22 that is relatively close to the force-sensing sensor 3, the signal with a smaller amplitude output by the force-sensing sensor 3 is amplified firstly and then transmitted. In this way, that situation that the signal output by the force-sensing sensor 3 is amplified after being distorted during the transmission process can be avoided to some extent, thereby avoiding amplifying the distorted signal in the meantime.

In the embodiment shown in FIG. 1, the force-sensing sensor 3 is located in a side part of the non-display area 2 close to the display area 1.

When the display panel is pressed, the closer a position of the display panel is to the center of the display panel, the greater the deformation of the position. Therefore, in order to improve the force-sensing effect of the force-sensing sensor 3, the force-sensing sensor 3 is provided in the side part of the non-display area 2 close to the display area 1. In this way, pressing can produce a greater deformation to make the sensor more sensitive, without adversely affecting the normal display effect.

Figure 8:
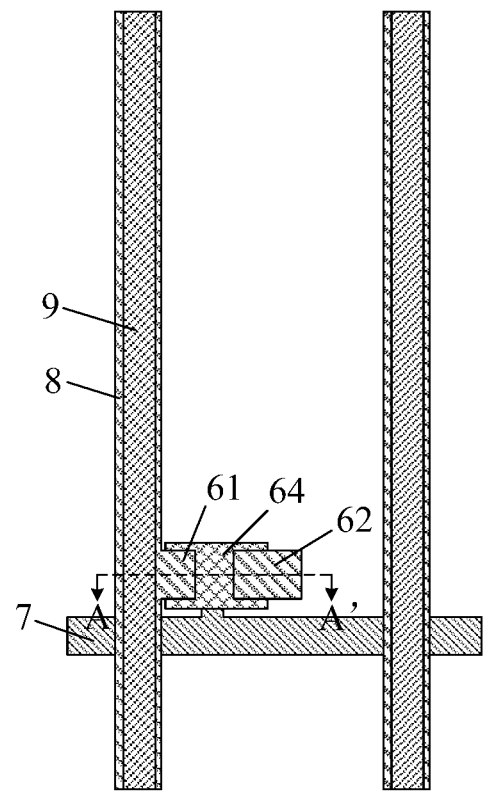
FIG. 8 is an enlarged schematic diagram of a part of a display area of the display panel shown in FIG. 1.
Figure 9:
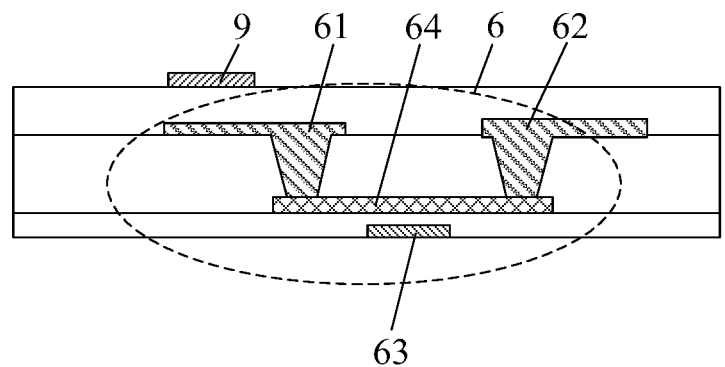
FIG. 9 is a cross-sectional diagram along line AA' in FIG. 8.

FIG. 8 is an enlarged schematic diagram of a part of a display area in the display panel shown in FIG. 1. FIG. 9 is a schematic cross-sectional diagram along direction AA' in FIG. 8. In an embodiment shown in FIG. 1, FIG. 8 and FIG. 9, the display panel further includes a thin film transistor 6 disposed in the display area. The thin film transistor 6 includes a source electrode 61, a drain electrode 62, a gate electrode 63 and an active layer 64. The force-sensing sensor 3 is made of polysilicon material, and arranged in the same layer as the active layer 64.

Since the active layer 64 in the thin film transistor 6 is also made of polysilicon material, the force-sensing sensor 3 and the active layer 64 that are disposed in the same layer can be formed in a same patterning process, saving an additional patterning process. For example, if the display panel is a liquid crystal display panel, the display panel includes a plurality of gate lines 7 and a plurality of data lines 8. The plurality of gate lines 7 and the plurality of data lines 8 intersect with one another and define a plurality of sub-pixel units arranged in an array. The display panel further includes a common electrode. Each of the sub-pixel units includes a thin film transistor 6 and a pixel electrode (not shown) connected to the thin film transistor 6. The source electrode 61 of the thin film transistor 6 is connected to an associated data line 8. The drain electrode 62 of the thin film transistor 6 is connected to the pixel electrode, and the gate electrode 63 of the thin film transistor 6 is connected to an associated gate line 7. The liquid crystal display panel further includes an array substrate, a color film substrate opposite to the array substrate, and a liquid crystal layer disposed between the array substrate and the color film substrate. The data lines 8 are used to transmit data signals and the gate lines 7 are used to transmit scan signals. During the operation of the liquid crystal display panel, the thin film transistors 6 associated with the plurality of gate lines 7 are sequentially turned on row by row under the control of the scan signals. In the meantime, the data lines 8 sequentially transmit the data signals to the respective associated pixel electrodes, so that the pixel electrodes are charged, and an electric field formed between the pixel electrode and the common electrode drives the liquid crystal in the liquid crystal layer to deflect, thereby achieving the normal display. The color film substrate includes a grid-shaped black matrix, and a plurality of color filters arranged in an array manner in openings of the black matrix. The color filters include red color filters, green color filters, and blue color filters.

It should be understood that other types of the display panels are also possible in other achievable embodiments. The present disclosure does not limit the type of the display panel.

Figure 10:
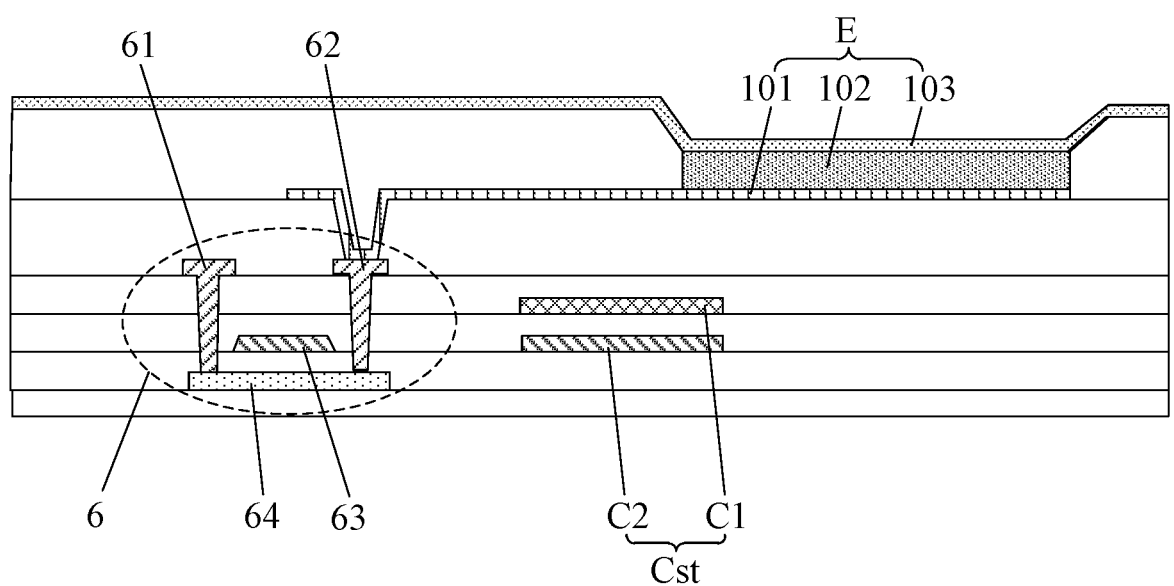
FIG. 10 is a cross-sectional diagram of a part of an organic light-emitting display panel according to an embodiment of the present disclosure.

For example, the display panel is an organic light-emitting display panel. The organic light-emitting display panel includes an array substrate having a plurality of pixel circuits. The organic light-emitting display panel further includes a plurality of organic light-emitting diodes (OLED) disposed on the array substrate. An anode of each organic light-emitting diode is electrically connected to a corresponding pixel circuit on the array substrate, as shown in FIG. 10. FIG. 10 is cross-sectional diagram of a part of an organic light-emitting display panel according to an embodiment of the present invention. The organic light-emitting diodes E each include an anode layer 101, a light-emitting layer 102 and a cathode layer 103, and the anode layer 101, the light-emitting layer 102 and the cathode layer 103 are arranged in sequence. The pixel circuit includes a thin film transistor 6. The thin film transistor 6 includes a source electrode 61, a drain electrode 62, a gate electrode 63 and an active layer 64. The pixel circuit further includes a storage capacitor Cst. The storage capacitor Cst includes a first electrode plate C1 and a second electrode plate C2. The gate electrode 63 and the second electrode plate C2 are located in a first conduction layer, the first electrode plate C1 is located in a second conduction layer, and the source electrode 61 and the drain electrode 62 are located in a third conduction layer. The third conduction layer, the second conduction layer, the first conduction layer, and the active layer 63 are sequentially arranged on a side of the anode layer 102 away from the cathode layer 103 along a direction away from the side of the anode layer 102. The anode layer 101 of the organic light-emitting diode E is connected to the drain electrode 62 of an associated thin film transistor through a through-hole. The plurality of light-emitting diodes includes light-emitting diodes for emitting red light, light-emitting diodes for emitting green light, and light-emitting diodes for emitting blue light. In addition, the organic light-emitting display panel further includes an encapsulation layer covering the plurality of the light-emitting diodes. It should be noted that FIG. 10 merely illustrates the storage capacitor Cst and one thin film transistor 6 directly connected to the organic light emitting diode E in the pixel circuit. Other transistors may have the same layer structure as this thin film transistor 6. In addition, the respective layer structure is not limited to the structure shown in FIG. 10. For example, the first electrode plate C1 and the second electrode plate C2 can be formed in other layers, as long as they can serve as two electrode plates capable of forming the capacitor. If the organic light-emitting diode E is a top emission structure, i.e., the organic light-emitting diode E emits light from a side of the cathode layer 103 away from the anode layer 101, each element in the pixel circuit may be arranged under the organic light-emitting diode E. If the organic light-emitting diode E is a bottom emission structure, i.e., the organic light-emitting diode E emits light from a side of the anode layer 101 away from the cathode layer 103, each element in the pixel circuit should be arranged outside the light-emitting area of the organic light-emitting diode E, in order to prevent negative effects on display.

For example, the display panel is a micro light-emitting diode display panel. The micro light-emitting diode display panel includes an array substrate having a plurality of pixel circuits. The micro light-emitting diode display panel further includes a plurality of micro light-emitting diodes (MicLEDs) arranged on the array substrate. An anode of each micro light-emitting diode is electrically connected to an associated pixel circuit in the array substrate. The plurality of micro light-emitting diodes include micro light-emitting diodes for emitting red light, micro light-emitting diodes for emitting green light and micro light-emitting diodes for emitting blue light. The micro light-emitting diodes can be formed on a mold substrate, and then subsequently transferred to the array substrate.

Figure 11:
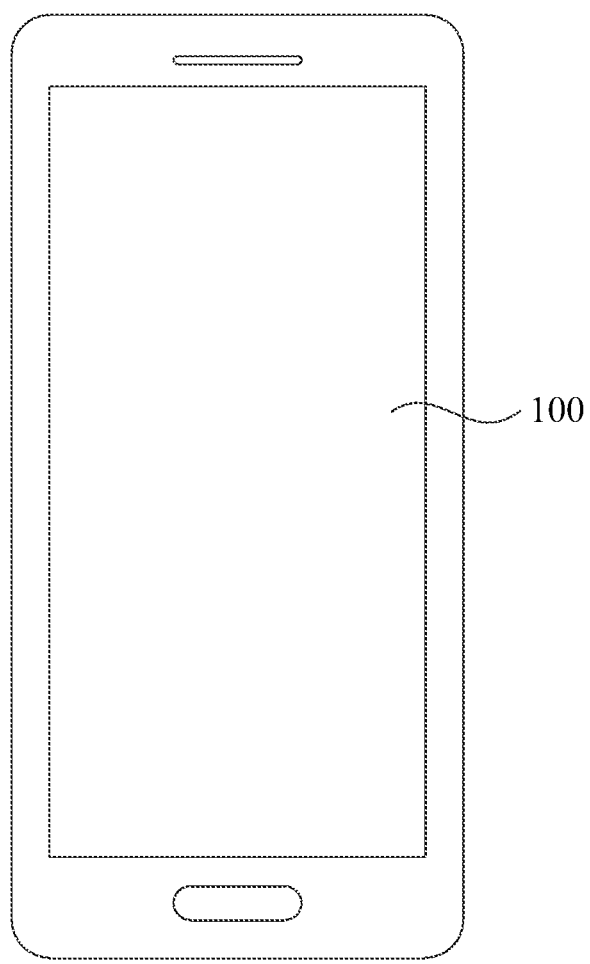
FIG. 11 is a highly simplified schematic diagram of a display device according to an embodiment of the present disclosure.

FIG. 11 is a schematic diagram of a display device according to an embodiment of the present invention. The display device includes the display panel 100 described above.

The specific structure and principle of the display panel 100 are same as that mentioned in any one of the above embodiments, which will not be repeated herein. The display device can be a touch panel, a mobile phone, a tablet computer, a portable computer, a television or any other electronic device with display function.

The display device according to the embodiment of the present invention is configured such that the force-sensing sensor is connected to the drive chip through the amplification circuit, i.e., the amplitude of output signal from the force-sensing sensor is amplified by the amplification circuit and then the amplified output signal is transmitted to the drive chip. In such way, the drive chip can detect force directly depending on the amplified signal, without increasing the bias voltage of the force-sensing sensor. In other words, the amplitude of output signal from the force-sensing sensor increases without increasing the heat generation of the force-sensing sensor. Therefore, adverse effects on the touch function or display function caused by high heat generation of the force-sensing sensor are reduced.

It should be noted that the above embodiments are merely used to explain the technical solutions of the present disclosure, but not intended to limit the present disclosure. Although the present disclosure is described in detail with reference to these embodiments, it should be understood that those skilled in the art are able to modify the technical solutions described in the embodiments or equivalently replace parts of or all technical features, without departing from the substantial protection scope of the present disclosure.

What is claimed is:

1. A display panel, comprising:
a force-sensing sensor comprising a first input, a second input, a first output and a second output;
an amplification circuit associated with the force-sensing sensor, wherein the amplification circuit comprises a first thin film transistor, a second thin film transistor, a first constant current source, a second constant current source, and at least one amplification output, wherein a first amplification input of the amplification circuit is coupled to the first output of the force-sensing sensor, and a second amplification input of the amplification circuit is coupled to the second output of the force-sensing sensor; and
a drive chip coupled to the at least one amplification output of the amplification circuit;
wherein the display panel further comprises a display area and a non-display area surrounding the display area, wherein the non-display area comprises a first area, a second area, a third area, and a fourth area, wherein the first area and the second area are located on two opposite sides of the display area in a first direction respectively; and the third area and the fourth area are located on two other opposite sides of the display area in a second direction, respectively, wherein the first and second directions are perpendicular;
wherein both the force-sensing sensor and the amplification circuit are located in the first area and/or the second area, and the drive chip is located in the third area, the force-sensing sensor is located at one side of the non-display area close to the display area; and
wherein the at least one amplification output comprises a first amplification output and a second amplification output;
wherein the first thin film transistor comprises a control end connected to the first output of the force-sensing sensor, a first end connected to a second reference potential end, and a second end connected to the first amplification output;
wherein the first constant current source comprises a first end connected to the first amplification output and a second end connected to a first reference potential end, such that the amplification circuit is adapted to amplify an amplitude of a first signal from the first output of the force-sensing sensor before outputting the first signal from the first output of the force-sensing sensor in a form of electric current to the first amplification output of the amplification circuit; and
wherein the second thin film transistor has a control end connected to the second output of the force-sensing sensor, a first end connected to the second reference potential end, and a second end connected to the second amplification output;
wherein the second constant current source comprises a first end connected to the second amplification output and a second end connected to the first reference potential end, such that the amplification circuit is further adapted to amplify an amplitude of a second signal from the second output of the force-sensing sensor before outputting the second signal from the second output of the force-sensing sensor in a form of electric current to the second amplification output of the amplification circuit.

2. The display panel according to claim 1, wherein the at least one amplification output comprises a first amplification output and a second amplification output, the amplification circuit being adapted to amplify an amplitude of a first voltage at the first output of the force-sensing sensor and then output the first voltage to the first amplification output of the amplification circuit, and amplification circuit being further adapted to amplify an amplitude of a second voltage at the second output of the force-sensing sensor and then output the second voltage to the second amplification output of the amplification circuit.

3. The display panel according to claim 1, wherein the amplification circuit is a differential amplification circuit comprising only one amplification output, and the differential amplification circuit is adapted to amplify a difference between a voltage value at the first output of the force-sensing sensor and a voltage value at the second output of the force-sensing sensor, and supply the amplified difference to an amplification output of the differential amplification circuit.

4. The display panel according to claim 3,
wherein a first end of the first thin film transistor is coupled to a first node, and a second end of the first thin film transistor is coupled to a second node;
wherein a first end of the second thin film transistor is coupled to a third node, and a second end of the second thin film transistor is coupled to the second node;
wherein the differential amplification circuit further comprises:
a third thin film transistor, wherein a control end of the third thin film transistor is coupled to a fourth node, a first end of the third thin film transistor is coupled to the first node, and a second end of the third thin film transistor is coupled to a second reference potential end;
a fourth thin film transistor, wherein a control end of the fourth thin film transistor is coupled to a fourth node, a first end of the fourth thin film transistor is coupled to the third node, and a second end of the fourth thin film transistor is coupled to a second reference potential end; and
a fourth constant current source, wherein a first end of the fourth constant current source is coupled to the second node, and a second end of the constant current source is coupled to a first reference potential end;
wherein the fourth node is coupled to the first node, and the third node is coupled to the amplification output of the amplification circuit; and
wherein the first thin film transistor and the second thin film transistor are N-type transistors, and the third thin film transistor and the fourth thin film transistor are P-type transistors; or
the first thin film transistor and the second thin film transistor are P-type transistors, and the third thin film transistor and the fourth thin film transistor are N-type transistors.

5. The display panel according to claim 1, wherein the force-sensing sensor is a Wheatstone bridge force-sensing sensor,
wherein the Wheatstone bridge force-sensing sensor comprises the first input, the second input, the first output, the second output, a first strain force-sensing sensor, a second strain force-sensing sensor, a third strain force-sensing sensor and a fourth strain force-sensing sensor, and
wherein the first strain force-sensing sensor is series-connected between the first input and the first output, the second strain force-sensing sensor is series-connected between the second input and the second output, the third strain force-sensing sensor is series-connected between the second input and the first output, and the fourth strain force-sensing sensor is series-connected between the first input and the second output.

6. The display panel according to claim 1, wherein the force-sensing sensor is a silicon piezoresistive force sensor.

7. The display panel according to claim 1, wherein the display panel further comprises a fifth thin film transistor located in the display area, wherein the fifth thin film transistor comprises an active layer, wherein the force-sensing sensor is made from polysilicon material, and wherein the force-sensing sensor and the active layer are located in a same layer.

8. A display device comprising a display panel, wherein the display panel comprises:

a force-sensing sensor comprising a first input, a second input, a first output and a second output;
an amplification circuit associated with the force-sensing sensor, wherein the amplification circuit comprises a first thin film transistor, a second thin film transistor, a first constant current source, a second constant current source, and at least one amplification output, wherein a first amplification input of the amplification circuit is coupled to the first output of the force-sensing sensor and a second amplification input of the amplification circuit is coupled to the second output of the force-sensing sensor; and
a drive chip coupled to the at least one amplification output of the amplification circuit;
wherein the display panel further comprises a display area and a non-display area surrounding the display area, wherein the non-display area comprises a first area, a second area, a third area, and a fourth area, wherein the first area and the second area are located on two opposite sides of the display area in a first direction respectively, and the third area and the fourth area are located on two other opposite sides of the display area in a second direction, respectively, wherein the first and second directions are perpendicular;
wherein both the force-sensing sensor and the amplification circuit are located in the first area and/or the second area, and the drive chip is located in the third area, the force-sensing sensor is located at one side of the non-display area close to the display area; and
wherein the at least one amplification output comprises a first amplification output and a second amplification output;
wherein the first thin film transistor comprises a control end connected to the first output of the force-sensing sensor, a first end connected to a second reference potential end, and a second end connected to the first amplification output;
wherein the first constant current source comprises a first end connected to the first amplification output and a second end connected to a first reference potential end, such that the amplification circuit is adapted to amplify an amplitude of a first signal from the first output of the force-sensing sensor and then output the first signal from the first output of the force-sensing sensor in a form of electric current to the first amplification output of the amplification circuit;
wherein the second thin film transistor has a control end connected to the second output of the force-sensing sensor, a first end connected to the second reference potential end, and a second end connected to the second amplification output; and
wherein the second constant current source has a first end connected to the second amplification output and a second end connected to the first reference potential end, such that the amplification circuit is further adapted to amplify an amplitude of a second signal from the second output of the force-sensing sensor and then output the second signal from the second output of the force-sensing sensor in a form of electric current to the second amplification output of the amplification circuit.

9. The display device according to claim 8, wherein the at least one amplification output comprises a first amplification output and a second amplification output, wherein the amplification circuit is adapted to amplify an amplitude of the first signal from the first output of the force-sensing sensor and then output the first signal in a form of electric current to the first amplification output of the amplification circuit, and the amplification circuit is further adapted to amplify an amplitude of the second signal from the second output of the force-sensing sensor and then output the second signal in a form of electric current to the second amplification output of the amplification circuit.

10. The display device according to claim 8, wherein the at least one amplification output comprises a first amplification output and a second amplification output, the amplification circuit is adapted to amplify an amplitude of a first voltage at the first output of the force-sensing sensor and then output the first voltage to the first amplification output of the amplification circuit, and amplification circuit is further adapted to amplify an amplitude of a second voltage at the second output of the force-sensing sensor and then output the second voltage to the second amplification output of the amplification circuit.

11. The display device according to claim 8, wherein the amplification circuit is a differential amplification circuit comprising only one amplification output, and the differential amplification circuit is adapted to amplify a difference between a voltage value at the first output of the force-sensing sensor and a voltage value at the second output of the force-sensing sensor, and supply the amplified difference to an amplification output of the differential amplification circuit.

12. The display device according to claim 11,
wherein a first end of the first thin film transistor is coupled to a first node, and a second end of the first thin film transistor is coupled to a second node;
wherein a control end of the second thin film transistor is coupled to the second output of the force-sensing sensor, a first end of the second thin film transistor is coupled to a third node, and a second end of the second thin film transistor is coupled to the second node;
wherein the differential amplification circuit further comprises:
a third thin film transistor, wherein a control end of the third thin film transistor is coupled to a fourth node, a first end of the third thin film transistor is coupled to the first node, and a second end of the third thin film transistor is coupled to a second reference potential end;
a fourth thin film transistor, wherein a control end of the fourth thin film transistor is coupled to a fourth node, a first end of the fourth thin film transistor is coupled to the third node, and a second end of the fourth thin film transistor is coupled to a second reference potential end; and
a fourth constant current source, wherein a first end of the fourth constant current source is coupled to the second node, and a second end of the constant current source is coupled to a first reference potential end;
wherein the fourth node is coupled to the first node, and the third node is coupled to the amplification output of the differential amplification circuit; and
wherein the first thin film transistor and the second thin film transistor are N-type transistors, and the third thin film transistor and the fourth thin film transistor are P-type transistors; or the first thin film transistor and the second thin film transistor are P-type transistors, and the third thin film transistor and the fourth thin film transistor are N-type transistors.

* * * * *